(12) United States Patent
AuBuchon et al.

(10) Patent No.: US 11,220,747 B2
(45) Date of Patent: Jan. 11, 2022

(54) COMPLEMENTARY PATTERN STATION DESIGNS

(71) Applicant: Applied Materials, Inc., Santa Clara, CA (US)

(72) Inventors: Joseph AuBuchon, San Jose, CA (US);
Sanjeev Baluja, Campbell, CA (US);
Michael Rice, Pleasanton, CA (US);
Arkaprava Dan, San Jose, CA (US);
Hanhong Chen, Milpitas, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/658,396

(22) Filed: Oct. 21, 2019

(65) Prior Publication Data

US 2020/0131636 A1 Apr. 30, 2020

Related U.S. Application Data

(60) Provisional application No. 62/751,913, filed on Oct. 29, 2018.

(51) Int. Cl.
*C23C 16/458* (2006.01)
*C23C 16/455* (2006.01)
(Continued)

(52) U.S. Cl.
CPC .... *C23C 16/45536* (2013.01); *C23C 16/4584* (2013.01); *C23C 16/46* (2013.01);
(Continued)

(58) Field of Classification Search
CPC ........ C23C 16/45502; C23C 16/45536; C23C 16/4584; C23C 16/46; C23C 16/463;
(Continued)

(56) References Cited

U.S. PATENT DOCUMENTS

2003/0101934 A1   6/2003  Dunham
2004/0187784 A1*  9/2004  Sferlazzo .......... C23C 16/45508
                                                                118/719
(Continued)

FOREIGN PATENT DOCUMENTS

KR    20080104807 A    12/2008
KR      101046613 B1    7/2011
(Continued)

OTHER PUBLICATIONS

PCT International Search Report and Written Opinion in PCT/US2019/057326 dated Mar. 25, 2020, 9 pages.

*Primary Examiner* — Lan Vinh
(74) *Attorney, Agent, or Firm* — Servilla Whitney LLC

(57) ABSTRACT

Apparatus and methods to process one or more wafers are described. A first processing station has a first gas flow pattern from one or more of a first gas diffuser, a first cooling channel pattern, or a first heater. A second processing station has a second gas flow pattern from one or more of a second gas diffuser, a second cooling channel pattern, or a second heater. The second gas diffuser, the second cooling channel pattern, or the second heater is rotated or translated relative to the first gas diffuser, the first cooling channel pattern, or the first heater to provide the second gas flow pattern complementary to the first gas flow pattern.

13 Claims, 15 Drawing Sheets

(51) Int. Cl.
*C23C 16/46* (2006.01)
*H01L 21/02* (2006.01)
*H01L 21/687* (2006.01)
*H01J 37/32* (2006.01)
*H01L 21/67* (2006.01)
*H01L 21/677* (2006.01)

(52) U.S. Cl.
CPC .. *H01J 37/32449* (2013.01); *H01J 37/32724* (2013.01); *H01J 37/32899* (2013.01); *H01L 21/0228* (2013.01); *H01L 21/02274* (2013.01); *H01L 21/67167* (2013.01); *H01L 21/67207* (2013.01); *H01L 21/67742* (2013.01); *H01L 21/68764* (2013.01); *H01J 2237/002* (2013.01); *H01J 2237/20214* (2013.01); *H01J 2237/3321* (2013.01)

(58) Field of Classification Search
CPC ............... C23C 16/54; H01J 2237/002; H01J 2237/20214; H01J 2237/3321; H01J 37/32449; H01J 37/32724; H01J 37/32899; H01L 21/67109; H01L 21/67126; H01L 21/67167; H01L 21/6719; H01L 21/67207; H01L 21/67742; H01L 21/68764; H01L 21/68771

USPC ............ 118/715, 719, 724, 729; 156/345.34, 156/345.37; 438/485, 758, 763
See application file for complete search history.

(56) References Cited

U.S. PATENT DOCUMENTS

| | | | |
|---|---|---|---|
| 2009/0028761 A1* | 1/2009 | Devine | H01L 21/67069 422/186.04 |
| 2011/0180000 A1* | 7/2011 | Qian | H01J 37/32458 118/719 |
| 2011/0180233 A1* | 7/2011 | Bera | H01L 21/67109 165/47 |
| 2014/0174362 A1* | 6/2014 | Kao | C23C 16/45536 118/723 R |
| 2015/0030766 A1* | 1/2015 | Lind | C23C 16/4405 427/209 |
| 2017/0053792 A1 | 2/2017 | Lu et al. | |

FOREIGN PATENT DOCUMENTS

| | | |
|---|---|---|
| KR | 101134277 B1 | 4/2012 |
| TW | 201622491 A | 6/2016 |
| TW | 201740435 A | 11/2017 |

\* cited by examiner

COMPLEMENTARY PATTERN STATION DESIGNS

CROSS-REFERENCE TO RELATED APPLICATIONS

This application claims priority to U.S. Provisional Application No. 62/751,913, filed Oct. 29, 2018, the entire disclosure of which is hereby incorporated by reference herein.

TECHNICAL FIELD

The present disclosure relates generally to apparatus and methods for processing a wafer. In particular, the disclosure relates to a processing chamber which provides complementary patterns at each processing station.

BACKGROUND

Current atomic layer deposition (ALD) processes have a number of potential issues and difficulties. Many ALD chemistries (e.g., precursors and reactants) are "incompatible", which means that the chemistries cannot be mixed together. If the incompatible chemistries mix, a chemical vapor deposition (CVD) process, instead of the ALD process could occur. The CVD process generally has less thickness control than the ALD process and/or can result in the creation of gas phase particles which can cause defects in the resultant device. For a traditional time-domain ALD process in which a single reactive gas is flowed into the processing chamber at a time, a long purge/pump out time occurs so that the chemistries are not mixed in the gas phase. A spatial ALD chamber can move one or more wafer(s) from one environment to a second environment faster than a time-domain ALD chamber can pump/purge, resulting in higher throughput.

In some applications, the semiconductor industry requires high quality films which can be deposited at lower temperatures (e.g., below 350° C.). To deposit high quality films at temperatures below where the film would be deposited with a thermal only process, alternative energy sources are needed. Plasma solutions can be used to provide the additional energy in the form of ions and radicals to the ALD film. The challenge is to get sufficient energy on the vertical side wall ALD film. Ions typically are accelerated through a sheath above the wafer surface in a direction normal to the wafer surface. Therefore, the ions provide energy to horizontal ALD film surfaces, but provide an insufficient amount of energy to the vertical surfaces because the ions moving parallel to the vertical surfaces. To achieve high sidewall film quality, very high RF (VHF) plasma or microwave plasma are used. These plasma sources provide high plasma density for better film quality, but have the disadvantage of poor plasma uniformity.

Current spatial ALD processing chambers rotate a plurality of wafers on a heated circular platen at a constant speed which moves the wafers from one processing environment to an adjacent environment. The different processing environments create a separation of the incompatible gases. However, current spatial ALD processing chambers do not enable high quality ALD films because of gas flow non-uniformity, temperature non-uniformity, and/or plasma non-uniformity, resulting in thickness non-uniformity, plasma damage and/or processing flexibility issues.

In current spatial ALD deposition tools (or other spatial processing chambers), where the primary deposition steps occur when the wafer is stationary in a processing station which simulates a single wafer chamber, the method of operation often involves having the wafer move to more than one of the same station type, resulting in high non-uniformity of films from the gas flow non-uniformity, temperature nonuniformity, and/or plasma exposure non-uniformity of the processing station. Therefore, there is a need in the art for improved deposition apparatus and methods.

SUMMARY

One or more embodiments of the disclosure are directed to a processing chamber. In one embodiment, a processing chamber comprises: a first processing station having a first gas flow pattern from one or more of a first gas diffuser, a first cooling channel pattern, or a first heater; and a second processing station having a second gas flow pattern from one or more of a second gas diffuser, a second cooling channel pattern, or a second heater, the second gas diffuser, the second cooling channel pattern, or the second heater rotated relative to the first gas diffuser, the first cooling channel pattern, or the first heater to provide the second gas flow pattern complementary to the first gas flow pattern.

Additional embodiments of the disclosure are directed to methods of forming a film. In one or more embodiments, a method of forming a film comprises: loading at least one wafer onto a substrate support surface; rotating the substrate support surface between a first processing station having a first gas flow pattern from one or more of a first gas diffuser, a first cooling channel pattern, or a first heater and a second processing station having a second gas flow pattern from one or more of a second gas diffuser, a second cooling channel pattern, or a second heater, the second gas diffuser, the second cooling channel pattern, or the second heater rotated relative to the first gas diffuser, the first cooling channel pattern, or the first heater to provide the second gas flow pattern complementary to the first gas flow pattern; and at each processing station, exposing a top surface of the wafer to a process condition to form a film having a substantially uniform thickness.

One or more embodiments are directed to a plasma processing chamber comprising: a first plasma processing station having a first plasma pixel pattern from a first plasma source, the first plasma source having a symmetrical pixel pattern with n-fold symmetry; and a second plasma processing station having a second plasma pixel pattern from a second plasma source, the second plasma source having a symmetrical pixel pattern with n-fold symmetry and rotated relative to the first plasma source to provide a second plasma pixel pattern complementary to the first plasma pixel pattern.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1:
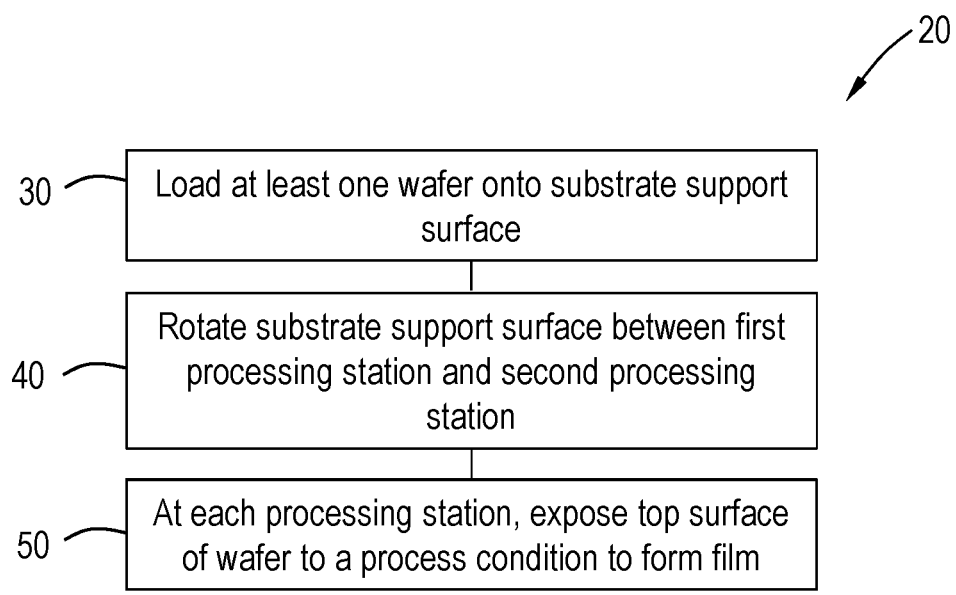
FIG. 1 depicts a flow process diagram of one embodiment of a method of forming a thin film according to embodiments described herein.

Before describing several exemplary embodiments of the disclosure, it is to be understood that the disclosure is not limited to the details of construction or process steps set forth in the following description. The disclosure is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus for example, where a film/layer or partial film/layer has been deposited onto a substrate surface, the exposed surface of the newly deposited film/layer becomes the substrate surface.

As used in this specification and the appended claims, the terms "precursor", "reactant", "reactive gas" and the like are used interchangeably to refer to any gaseous species that can react with the substrate surface, or with a film formed on the substrate surface. As used in this specification and the appended claims, the terms "plasma pixel", "plasma source" and the like are used interchangeably to refer to any independently controlled plasma generating element on a plasma processing station.

One or more embodiments of the disclosure use a processing tool, where the primary processing steps occur when the wafer is stationary in a processing station which simulates a single wafer chamber. In one or more embodiments, the method of operation involves moving a substrate support surface to more than one of the same station type, where the two stations are advantageously designed such that they complement each other in some way, improving the uniformity of the film thickness and other film properties on the wafer.

One or more embodiments of the disclosure are directed to processing chambers having at least two spatially separated processing environments, also referred to as processing stations. Some embodiments have more than two and some embodiments have more than four processing stations. The processing environments can be mounted coplanar to the wafer(s) that are moving in a horizontal plane. The process environments are placed in a circular arrangement. A rotatable structure with one to four (or more) individual wafer heaters mounted thereon moves the wafers in a circular path with a diameter similar to the process environments. Each heater may be temperature controlled and may have one or multiple concentric zones. For wafer loading, the rotatable structure could be lowered so that a vacuum robot could pick finished wafers and place unprocessed wafers on lift pins located above each wafer heater (in the lower Z position). In operation, each wafer can be under an independent environment until the process is finished, then rotatable structure can rotate to move the wafers on the heaters to the next environment (90° rotation for four stations, 120° rotation if three stations) for processing.

In a spatial ALD deposition tool (or other spatial processing chamber), a wafer is moved into a first processing station and then subsequently moved to a second processing station. In some cases, the first and second processing stations are the same, resulting in a lack of uniformity in film thickness, and a lack of uniformity in deposition properties of the films (e.g. refractive index, wet etch rate, in-plane displacement, etc.).

One or more embodiments, advantageously provide a processing chamber wherein different stations in a processing tool (e.g. spatial tool) are designed to result in improved uniformity in film thickness, and improved uniformity in refractive index, wet etch rate, in-plane displacement of the deposited film.

FIG. 1 depicts a flow diagram of a method 10 of depositing a film in accordance with one or more embodiments of the present disclosure. With reference to FIG. 1, the method 20 begins at operation 30, where at least one wafer is loaded onto a substrate support surface. At operation 40, the substrate support surface is rotated between a first processing station and a second processing station. In one or more embodiments, the first processing station has a first gas flow pattern from one or more of a first gas diffuser, a first cooling channel pattern, or a first heater, and the second processing station has a second gas flow pattern from one or more of a second gas diffuser, a second cooling channel, or a second heater. One or more of the second gas diffuser, the second cooling channel pattern, or the second heater is rotated relative to one or more of the first gas diffuser, the first cooling channel pattern, or the first heater to provide the second gas flow pattern complementary to the first gas flow pattern. At operation 50, at each processing station, the top surface of the at least one wafer is exposed to a process condition to form a film. In one or more embodiments, the process condition comprises one or more of a temperature, a pressure, a reactive gas, or the like. In one or more embodiments, the film that is formed has a substantially uniform thickness. As used herein, the term "substantially uniform" refers to film thicknesses that are within ±5 nm, ±4 nm, ±3 nm, ±2 nm or ±1 nm of the films formed.

In one or more embodiments, the at least one wafer is stationary when the film is formed. In one or more embodiments, each of the first gas diffuser, the first cooling channel pattern, or the first heater and the second gas diffuser, the second cooling channel pattern, or the second heater have a symmetrical hole pattern with n-fold symmetry. As used herein, the term "n-fold symmetry" refers to the quality of being made up of exactly similar parts facing each other around an axis. As used herein, "n-fold" refers to the number of rotations around the axis about which the symmetrical hole pattern can be arranged and symmetry maintained. In one or more embodiments, n is an integer in a range of 1 to 10. In other embodiments, n is an integer number in a range of 2 to 10. In one or more embodiments, n is selected from 1, 2, 3, 4, 5, 6, 7, 8, 9, or 10. In other embodiments, n is selected from 2, 3, 4, 5, 6, 7, 8, 9, or 10. In one or more embodiments, n is 2. As used herein, "hole" refers to an opening, a cavity, a perforation, or the like in one or more of the first gas diffuser, the first cooling channel pattern, the first heater, the second gas diffuser, the second cooling channel pattern, or the second heater, through which a gas, a plasma, or the like can pass. In some embodiments, the hole is circular. In the other embodiments, the hole can be any shape desired, including, but not limited to, triangular, square, rectangular, hexagonal, heptagonal, octagonal, star-shape, and the like. In some embodiments, the hole pattern (i.e., the overall pattern formed by the plurality of openings) are arranged in a circular, triangular, square, rectangular, hexagonal, heptagonal, octagonal, star-shape, and the like.

In some embodiments, one or more of the second gas diffuser, the second cooling channel pattern, or the second heater is rotated around a central axis by an amount less than or equal to about $(360/(n*2))$ degrees relative to one or more of the first gas diffuser, the first cooling channel pattern, or the first heater. When the first gas diffuser, first cooling channel patter or first heater shares a common central axis with the second gas diffuser, second cooling channel pattern or second heater, the maximum difference in patterns occurs when the patterns are rotated $(360/(n*2))$. Rotation beyond that amount causes the pattern differential to decrease. Thus, for example, when the symmetry of the hole pattern is 2-fold (i.e. n=2), one or more of the second gas diffuser, the second cooling channel pattern, or the second heater is rotated less than or equal to about 90° (i.e. $(360/(n*2))=(360/(2*2))=(360/4)=90$ degrees) relative to the first gas diffuser, the first cooling channel pattern, or the first heater.

In one or more embodiments, each of the first gas diffuser, the first cooling channel pattern, or the first heater and the second gas diffuser, the second cooling channel pattern, or the second heater have an identical symmetrical hole pattern with n-fold symmetry, and one or more of the second gas diffuser, the second cooling channel pattern, or the second heater is rotated less than or equal to about $(360/(n*2))$ degrees relative to the first gas diffuser, the first cooling channel pattern, or the first heater. The skilled artisan will recognize that the rotation of less than or equal to about $(360/(n*2))$ is relevant for patterns sharing a common central axis. Patterns with offset central axis can have a different amount of rotation to provide a maximum differential.

In one or more embodiments, the method 10 further comprises controlling the speed of rotation of the substrate support surface.

Figures 2A, 2B:
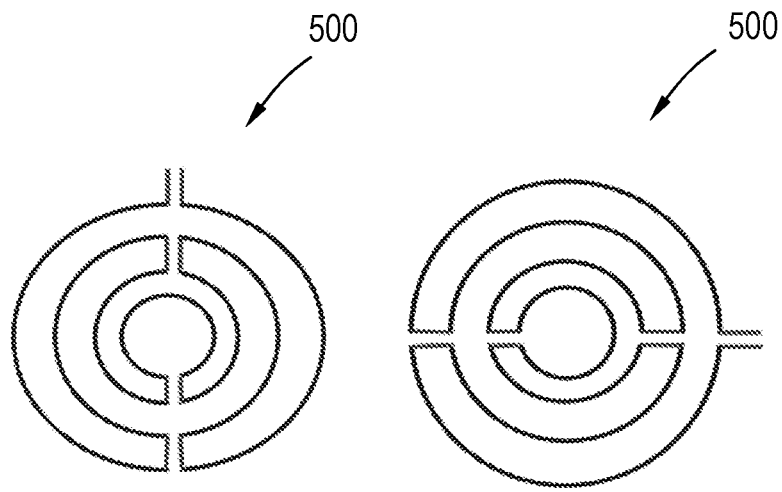
FIG. 2A illustrates a heating coil according to embodiments described herein.
FIG. 2B illustrates a heating coil that is complimentary to the heating coil of FIG. 2A according to embodiments described herein.

FIGS. 2A and 2B show a heater coil 500. The heater coil 500 of FIG. 2B is complimentary to the heater coil 500 in FIG. 2A.

Figures 3A, 3B:
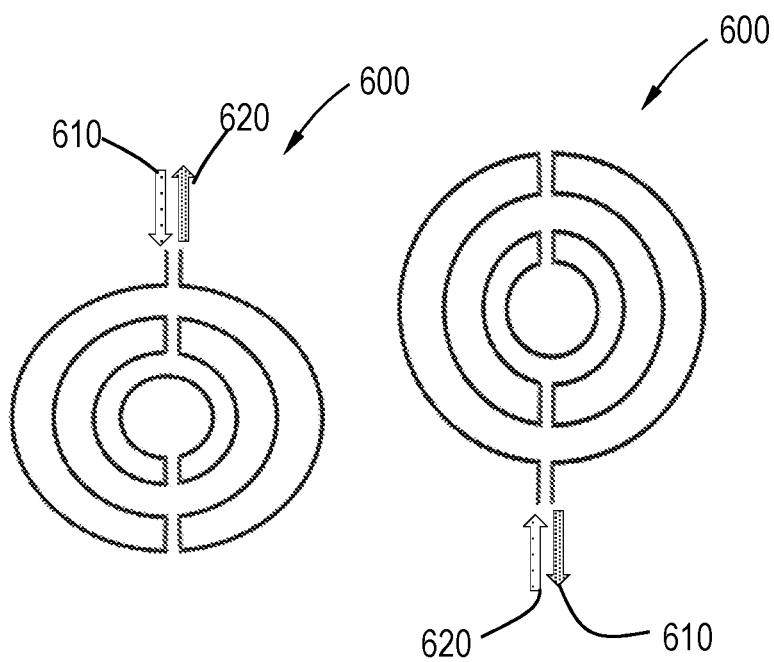
FIG. 3A illustrates a cooling channel according to embodiments described herein.
FIG. 3B illustrates a cooling channel that is complimentary to the cooling coil of FIG. 3A according to embodiments described herein.

FIGS. 3A and 3B show a cooling channel 600. Referring to FIG. 3A, the channel 600 has an inlet 610 for cooling water and an outlet 620, where cooling water exits. FIG. 3B is complimentary to the coil 600 in FIG. 3A.

In one or more embodiments, a processing chamber comprises a first processing station having a first gas flow pattern from one or more of a first gas flow pattern from a first gas diffuser, a first cooling channel pattern, or a first heater; a second processing station having a second gas flow pattern from one or more of a second gas diffuser, a second cooling channel pattern, or a second heater, the second gas diffuser, the second cooling channel pattern, or the second heater rotated relative to the first gas diffuser, the first cooling channel pattern, or the first heater to provide the second gas flow pattern complementary to the first gas flow pattern.

In one or more embodiments, a processing chamber having multiple processing stations with alternating thermal processing stations and plasma processing stations is provided. Each plasma processing station is composed of multiple plasma pixels (independently controlled plasma generating element), a gas diffuser, a cooling channel, and a heater. Each of the plasma pixel pattern, gas diffuser, the cooling channel pattern, or the heater of the first plasma station and the plasma pixel pattern, the gas diffuser, the cooling channel, or the heater of the second plasma station have a symmetrical pattern with n-fold symmetry.

One or more embodiments are directed to a plasma processing chamber comprising: multiple processing stations with alternating thermal processing stations and plasma processing stations. Each plasma station is composed of multiple plasma pixels (independently controlled plasma generating element), gas diffuser, cooling channel, and heater. The film non-uniformity is affected by the relative position of the wafer to the plasma pixel pattern, gas diffuser, cooling channel, and heater of the plasma station when the wafer is stationary under the plasma station. Of the plasma stations, a first plasma processing station has a first plasma pixel pattern from a first plasma source, the first plasma source having a symmetrical pixel pattern with n-fold symmetry; and a second plasma processing station has a second plasma pixel pattern from a second plasma source, the second plasma source having a symmetrical pixel pattern with n-fold symmetry and rotated relative to the first plasma source to provide a second plasma pixel pattern complementary to the first plasma pixel pattern.

Figure 4A:
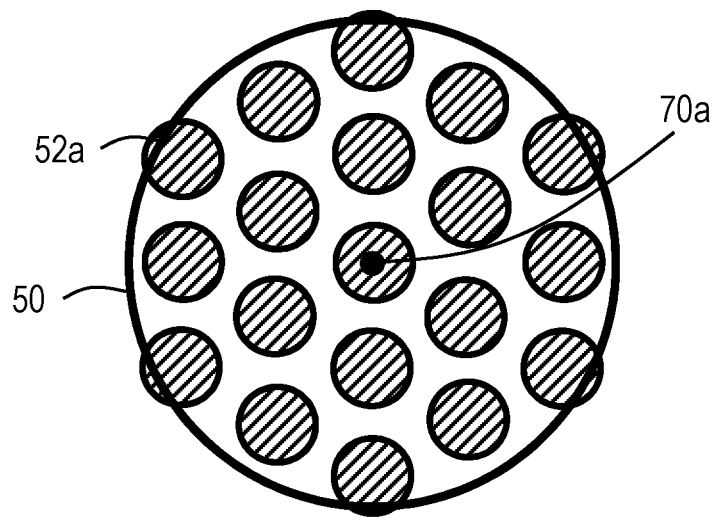
FIG. 4A depicts a plasma source with a pixel pattern according to one or more embodiments.
Figure 4B:
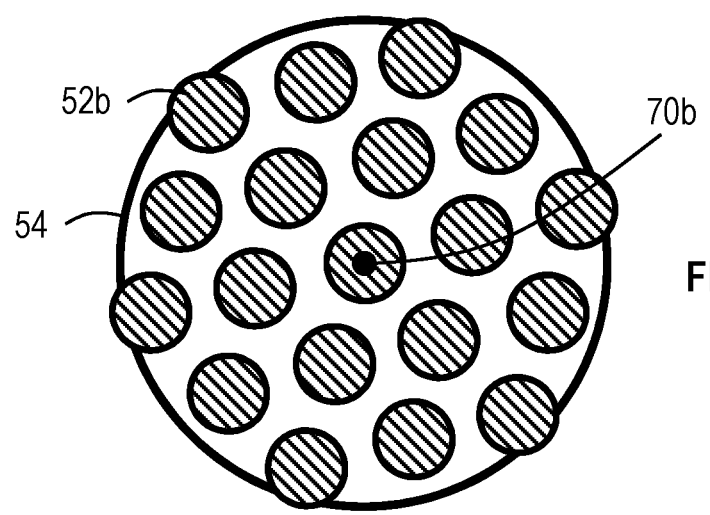
FIG. 4B depicts a plasma source with a pixel pattern according to one or more embodiments.
Figure 4C:
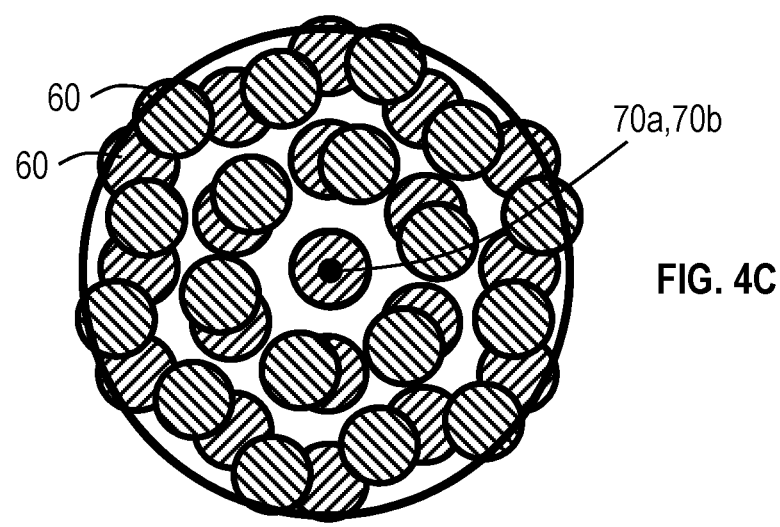
FIG. 4C depicts a complementary plasma pixel pattern according to one or more embodiments.

FIGS. 4A-11C illustrate various complimentary plasma pixel patterns that may result when a second plasma station is rotated relative to a first plasma station according to one or more embodiments. In FIG. 4A, a first plasma pixel pattern 50 has a symmetrical hexagonal pattern 52a with 4-fold symmetry around axis 70a. Referring to FIG. 4B, a second plasma pixel pattern 54 has a symmetrical hexagonal pattern 52b with 4-fold symmetry and rotated around axis 70b relative to the first plasma pixel pattern 50. In one or more embodiments, the first plasma pixel pattern 50 and the second plasma pixel pattern 54 have an identical symmetrical hexagonal pattern with n-fold symmetry and a shared central axis 70a, 70b. In one or more embodiments, the second plasma pixel pattern 54 is rotated less than or equal to about $(360/(n*2))$ degrees relative to the first plasma pixel pattern 50. Accordingly, referring to FIGS. 4A and 4B, the second plasma pixel pattern 54 is rotated less than or equal to about 45 degrees relative to the first plasma pixel pattern 50 (n=4; 360/(4*2)=45). When a wafer is processed sequentially under each of the first plasma pixel pattern 50 and the second plasma pixel pattern 54, the result is a film 60 having a substantially uniform plasma exposure and high thickness uniformity. In one or more embodiments, the film 60 also has one or more of a uniform refractive index, a uniform wet etch rate, or a uniform film stress.

Figure 5A:
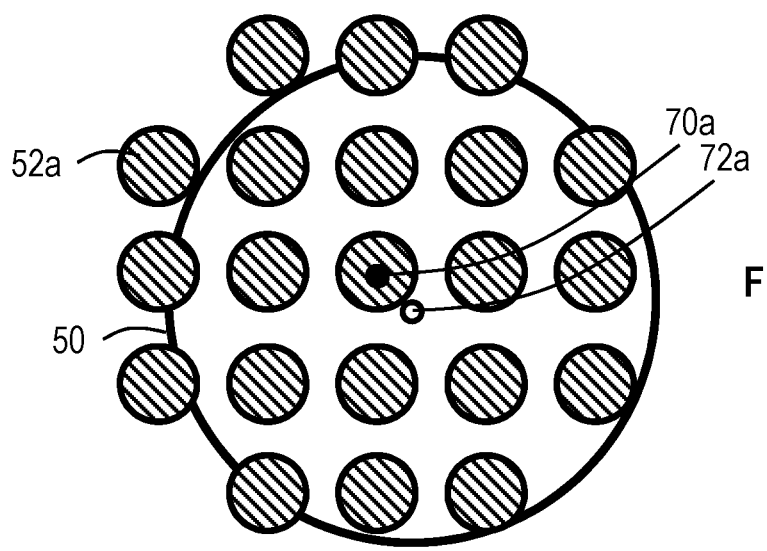
FIG. 5A depicts a plasma source with a pixel pattern according to one or more embodiments.
Figure 5B:
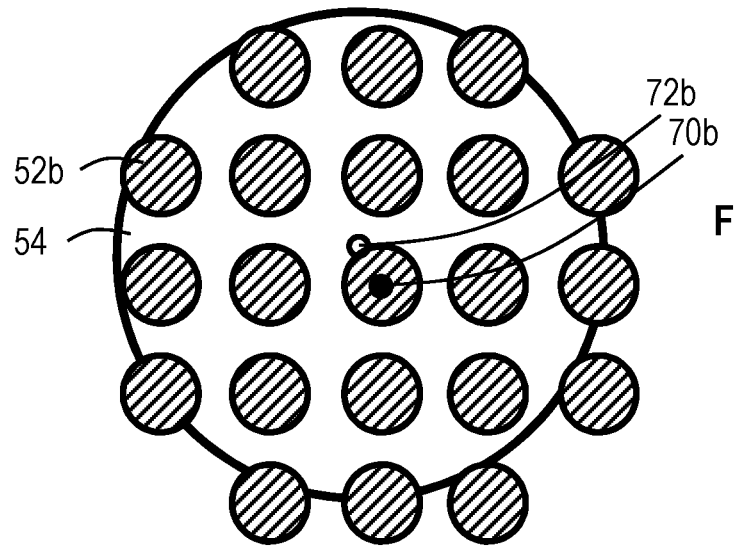
FIG. 5B depicts a plasma source with a pixel pattern according to one or more embodiments.
Figure 5C:
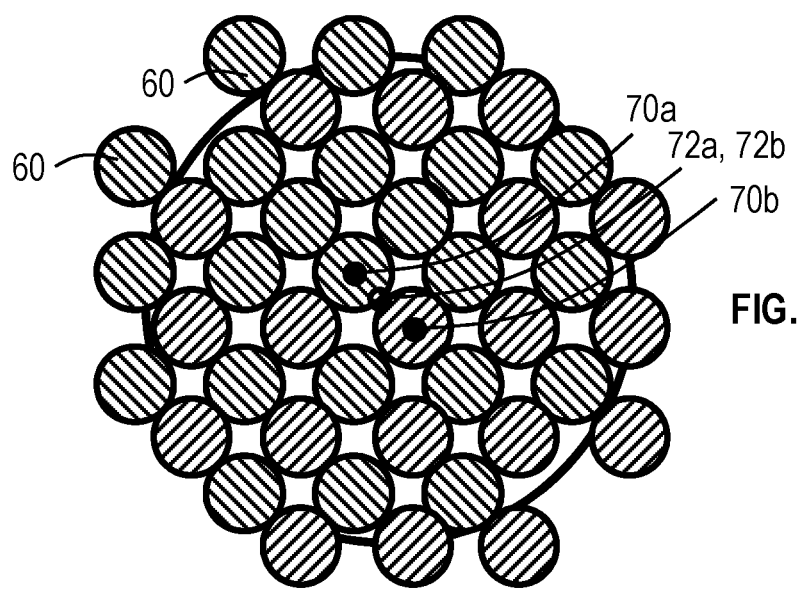
FIG. 5C depicts a complementary plasma pixel pattern according to one or more embodiments.

Referring to FIG. 5A, a first plasma pixel pattern 50 has a symmetrical square pattern 52a with 4-fold symmetry around axis 70a. Referring to FIG. 5B, a second plasma pixel pattern 54 has a symmetrical square pattern 52b with 4-fold symmetry around axis 70b. The axis 70b is offset from axis 70a. FIG. 5C illustrates the combination patterns of FIGS. 5A and 5B including the axes 70a, 70b. The skilled artisan will recognize that rotation of the pattern around the axis is not presented in this exemplary embodiment. Rather, the translation of the pattern from axis 70a to axis 70b provides maximum pattern differential.

In another embodiment, the plasma pixel pattern 50 in FIG. 5A has an axis 72a around which the hole pattern has been arranged and the plasma pixel pattern 54 in FIG. 5B has an axis 72b around which the hold pattern has been arranged. In this embodiment the axis 72a and axis 72b are shared or coaxial and the hole patterns are not symmetrical. The hole patterns of FIGS. 5A and 5B can be combined to form the pattern exemplified in FIG. 5C by 90° or 180° rotation. While no symmetry is illustrated in this configuration, for rotation calculation purposes, this can be considered 1-fold symmetry (n=1), resulting in 180°.

In one or more embodiments, the first plasma pixel pattern 50 and the second plasma pixel pattern 54 have an identical symmetrical square pattern with n-fold symmetry. In one or more embodiments, the second plasma pixel pattern 54 is rotated less than or equal to about $(360/(n*2))$ degrees relative to the first plasma pixel pattern 50. Accordingly, referring to FIGS. 5A and 5B, the second plasma pixel pattern 54 is rotated less than or equal to about 90 degrees relative to the first plasma pixel pattern 50. When a wafer is processed sequentially under each of the first plasma pixel pattern 50 and the second plasma pixel pattern 54, the wafer has a complementary plasma exposure to the first plasma pixel pattern and the second plasma pixel pattern 60, illustrated in FIG. 5C. The result is a film having a substantially uniform plasma exposure and high thickness and property uniformity.

Figure 6A:
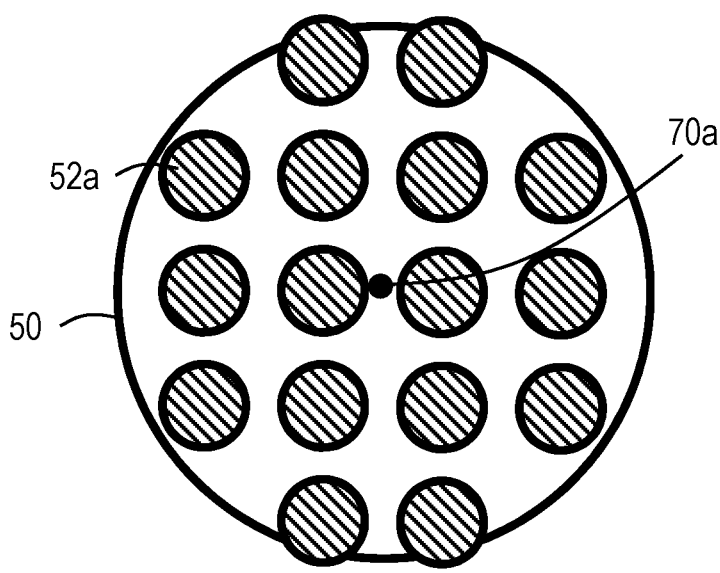
FIG. 6A depicts a plasma source with a pixel pattern according to one or more embodiments.
Figure 6B:
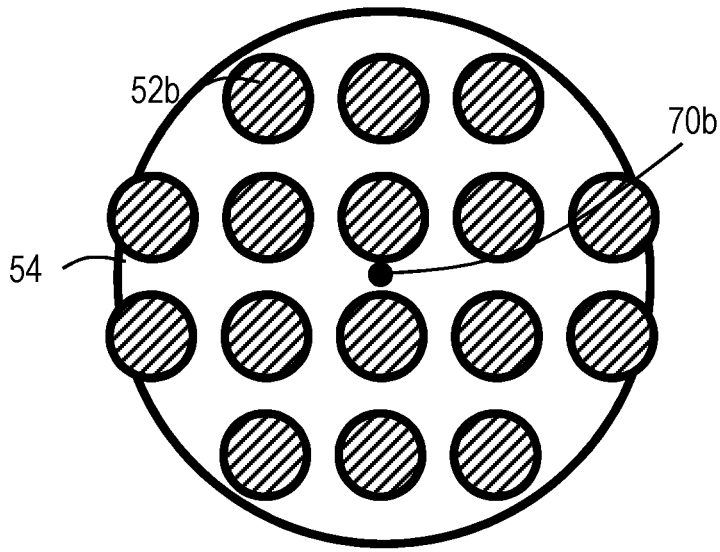
FIG. 6B depicts a plasma source with a pixel pattern according to one or more embodiments.
Figure 6C:
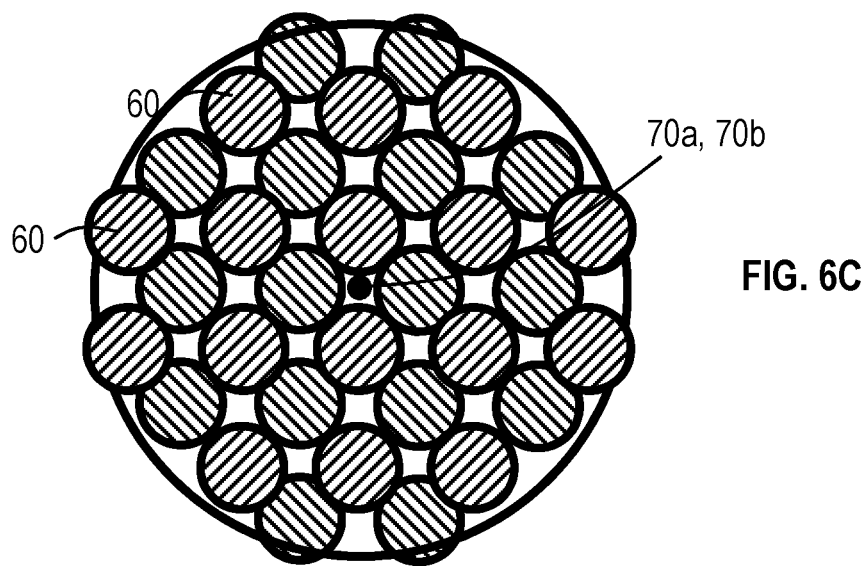
FIG. 6C depicts a complementary plasma pixel pattern according to one or more embodiments.

Referring to FIG. 6A, a first plasma pixel pattern 50 has a symmetrical rectangular pattern 52a with 2-fold symmetry around axis 70a. Referring to FIG. 6B, a second plasma pixel pattern 54 has a symmetrical rectangular pattern 52b with 2-fold symmetry around axis 70b and rotated relative to the first plasma pixel pattern 50. In one or more embodiments, the first plasma pixel pattern 50 and the second plasma pixel pattern 54 have an identical symmetrical rectangular pattern with n-fold symmetry. In one or more embodiments, the second plasma pixel pattern 54 is rotated less than or equal to about $(360/(n*2))$ degrees relative to the first plasma pixel pattern 50. Accordingly, referring to FIGS. 4A and 4B, the second plasma pixel pattern 54 is rotated less than or equal to about 90 degrees relative to the first plasma pixel pattern 50. When a wafer is processed sequentially under each of the first plasma pixel pattern 50 and the second plasma pixel pattern 54, the wafer has a complementary plasma exposure to the first plasma pixel pattern and the second plasma pixel pattern 60, illustrated in FIG. 6C. The result is a film having a substantially uniform plasma exposure and high thickness and property uniformity.

Figure 7A:
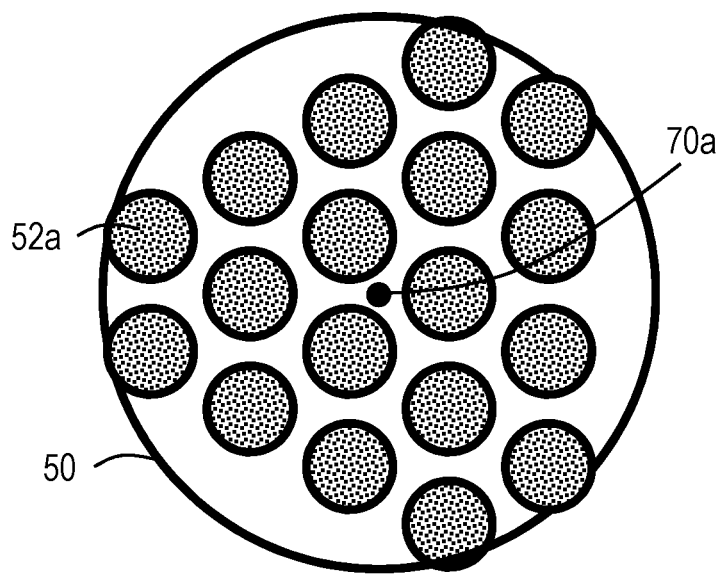
FIG. 7A depicts a plasma source with a pixel pattern according to one or more embodiments.
Figure 7B:
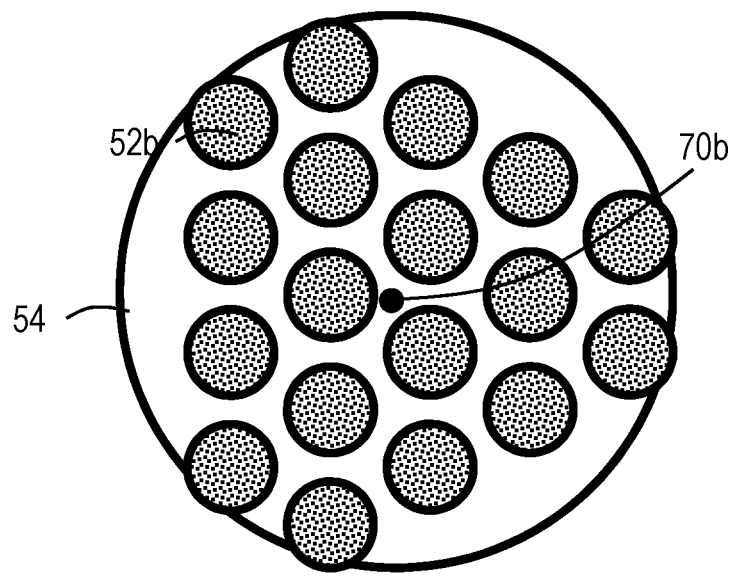
FIG. 7B depicts a plasma source with a pixel pattern according to one or more embodiments.
Figure 7C:
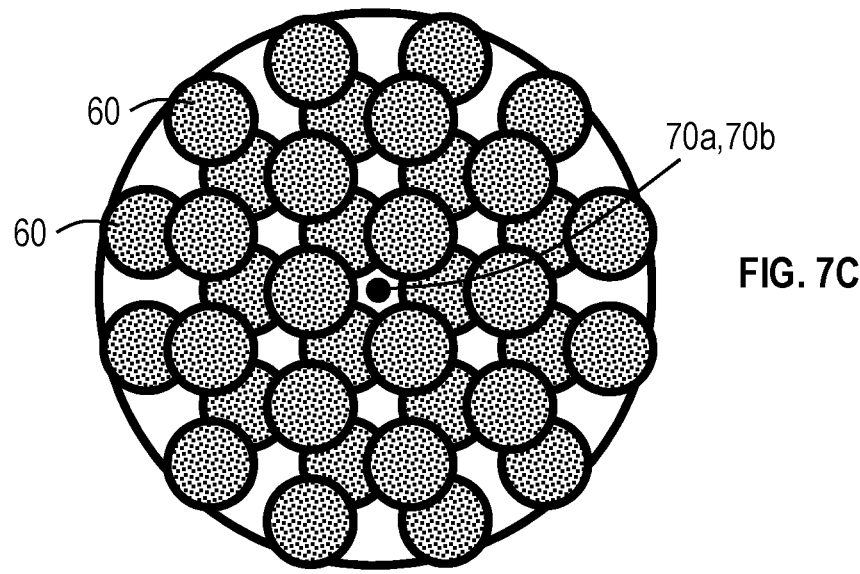
FIG. 7C depicts a complementary plasma pixel pattern according to one or more embodiments.

Referring to FIG. 7A, a first plasma pixel pattern 50 has a symmetrical hexagonal pattern 52a with 3-fold symmetry around axis 70a. Referring to FIG. 7B, a second plasma pixel pattern 54 has a symmetrical hexagonal pattern 52b with 3-fold symmetry around axis 70b and rotated relative to the first plasma pixel pattern 50. In one or more embodiments, the first plasma pixel pattern 50 and the second plasma pixel pattern 54 have an identical symmetrical hexagonal pattern with n-fold symmetry. In one or more embodiments, the second plasma pixel pattern 54 is rotated less than or equal to about $(360/(n*2))$ degrees relative to the first plasma pixel pattern 50. Accordingly, referring to FIGS. 7A and 7B, the second plasma pixel pattern 54 is rotated less than or equal to about 60 degrees relative to the first plasma pixel pattern 50. When a wafer is processed sequentially under each of the first plasma pixel pattern 50 and the second plasma pixel pattern 54, the wafer has a complementary plasma exposure to the first plasma pixel pattern and the second plasma pixel pattern 60, illustrated in FIG. 7C. The result is a film having a substantially uniform plasma exposure and high thickness and property uniformity.

Figure 8A:
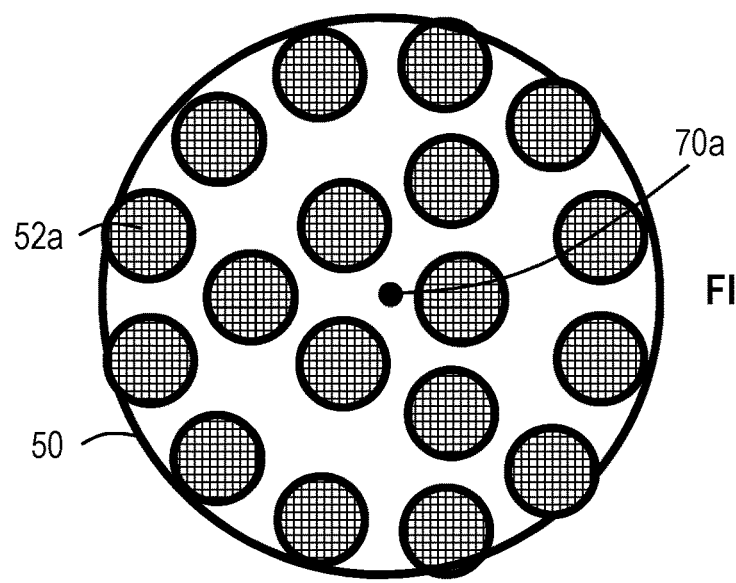
FIG. 8A depicts a plasma source with a pixel pattern according to one or more embodiments.
Figure 8B:
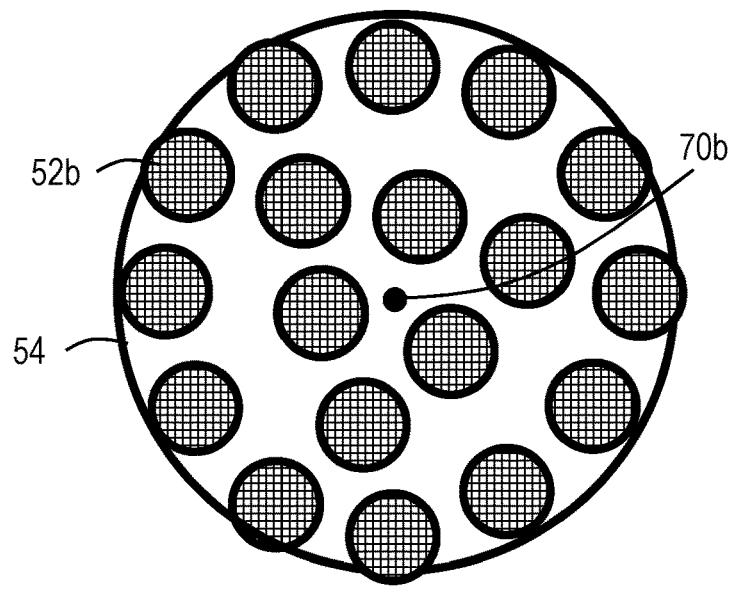
FIG. 8B depicts a plasma source with a pixel pattern according to one or more embodiments.
Figure 8C:
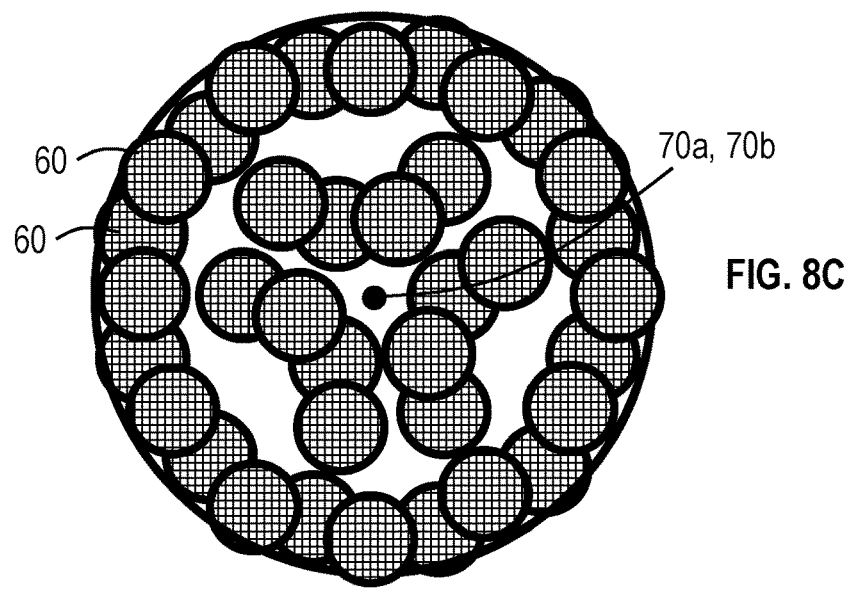
FIG. 8C depicts a complementary plasma pixel pattern according to one or more embodiments.

Referring to FIG. 8A, a first plasma pixel pattern 50 has a symmetrical outer ring plus hexagonal pattern 52a with 3-fold symmetry around axis 70a. Referring to FIG. 8B, a second plasma pixel pattern 54 has a symmetrical outer ring plus hexagonal pattern 52b with 3-fold symmetry around axis 70b and rotated relative to the first plasma pixel pattern 50. In one or more embodiments, the first plasma pixel pattern 50 and the second plasma pixel pattern 54 have an identical symmetrical outer ring plus hexagonal pattern with n-fold symmetry. In one or more embodiments, the second plasma pixel pattern 54 is rotated less than or equal to about (360/(n*2)) degrees relative to the first-plasma pixel pattern 50. Accordingly, referring to FIGS. 6A and 6B, the second plasma pixel pattern 54 is rotated less than or equal to about 90 degrees relative to the first plasma pixel pattern 50. When a wafer is processed sequentially under each of the first plasma pixel pattern 50 and the second plasma pixel pattern 54, the wafer has a complementary plasma exposure to the first plasma pixel pattern and the second plasma pixel pattern 60, illustrated in FIG. 8C. The result is a film having a substantially uniform plasma exposure and high thickness and property uniformity.

Figure 9A:
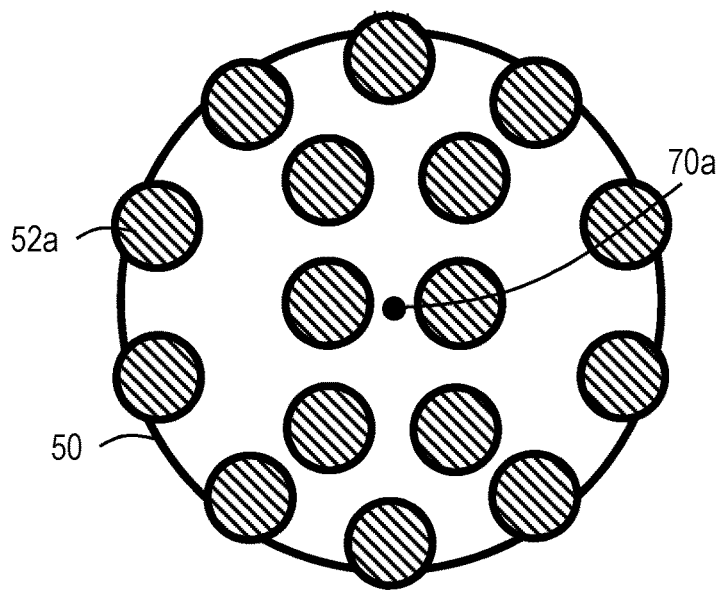
FIG. 9A depicts a plasma source with a pixel pattern according to one or more embodiments.
Figure 9B:
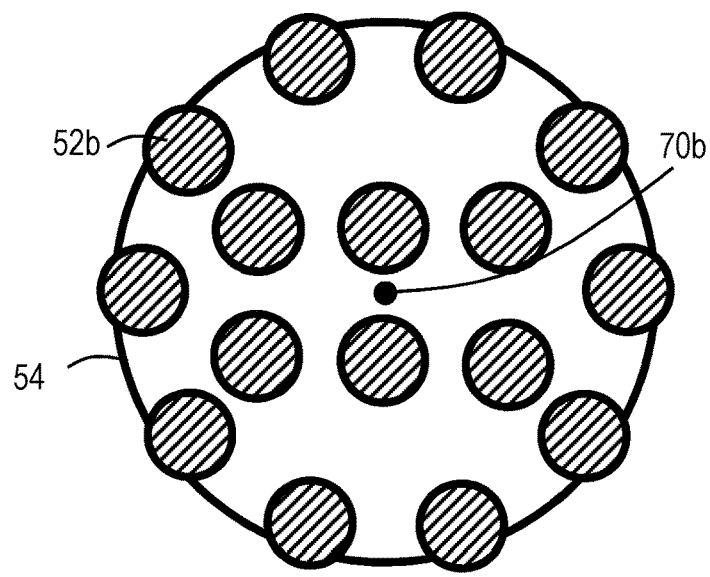
FIG. 9B depicts a plasma source with a pixel pattern according to one or more embodiments.
Figure 9C:
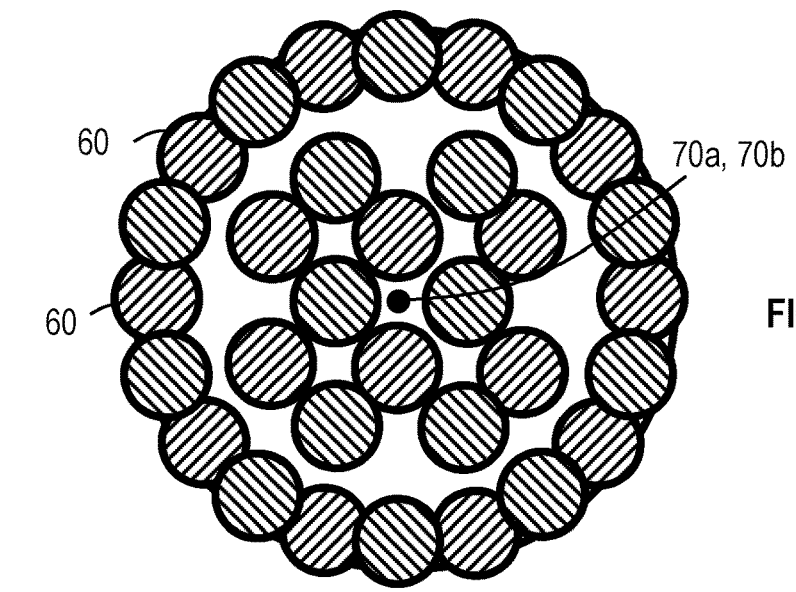
FIG. 9C depicts a complementary plasma pixel pattern according to one or more embodiments.

Referring to FIG. 9A, a first plasma pixel pattern 50 has a symmetrical outer ring plus rectangular pattern 52a with 2-fold symmetry around axis 70a. Referring to FIG. 9B, a second plasma pixel pattern 54 has a symmetrical outer ring plus rectangular pattern 52b with 2-fold symmetry around axis 70b and rotated relative to the first plasma pixel pattern 50. In one or more embodiments, the first plasma pixel pattern 50 and the second plasma pixel pattern 54 have an identical symmetrical outer ring plus rectangular pattern with n-fold symmetry. In one or more embodiments, the second plasma pixel pattern 54 is rotated less than or equal to about (360/(n*2)) degrees relative to the first plasma pixel pattern 50. Accordingly, referring to FIGS. 9A and 9B, the second plasma pixel pattern 54 is rotated less than or equal to about 90 degrees relative to the first plasma pixel pattern 50. When a wafer is processed sequentially under each of the first plasma pixel pattern 50 and the second plasma pixel pattern 54, the wafer has a complementary plasma exposure to the first plasma pixel pattern and the second plasma pixel pattern 60, illustrated in FIG. 9C. The result is a film having a substantially uniform plasma exposure and high thickness and property uniformity.

Figure 10A:
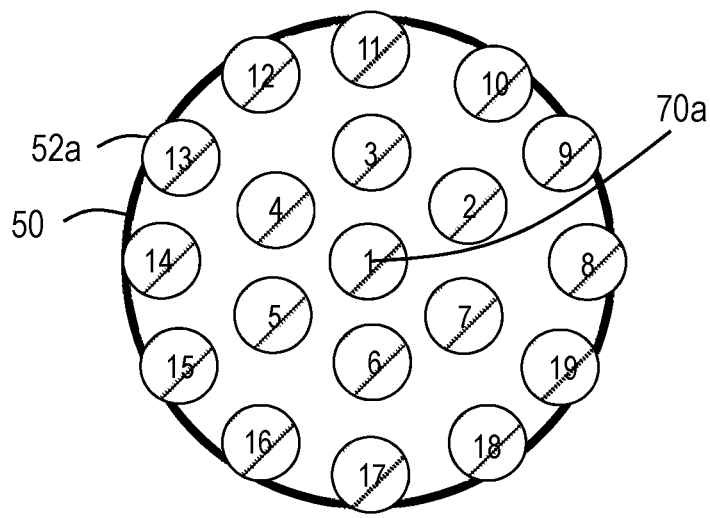
FIG. 10A depicts a plasma source with a pixel pattern according to one or more embodiments.
Figure 10B:
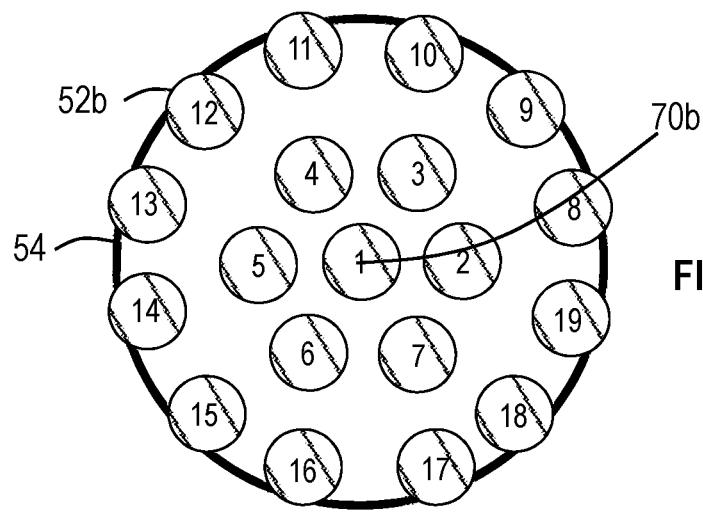
FIG. 10B depicts a plasma source with a pixel pattern according to one or more embodiments.
Figure 10C:
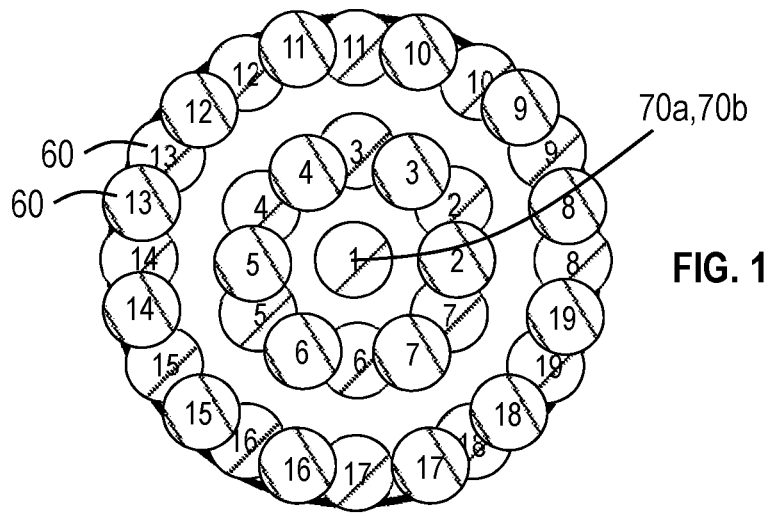
FIG. 10C depicts a complementary plasma pixel pattern according to one or more embodiments.

Referring to FIG. 10A, a first plasma pixel pattern 50 has an outer ring plus a radial pattern 52a with nineteen pixels (numbered 1-19) around axis 70a. Referring to FIG. 10B, a second plasma pixel pattern 54 has an outer ring plus a radial pattern 52b with nineteen sources (numbered 1-19) around axis 70b and rotated slightly relative to the first plasma pixel pattern 50. The pixels (numbered 2-7) of the second plasma pixel pattern has 30 degrees rotated relative to the pixels (numbered 2-7) of the first plasma pixel pattern. The pixels (numbered 8-19) of the second plasma pixel pattern have 15 degrees rotated relative to the pixels (numbered 8-19) of the first plasma pixel pattern. When a wafer is processed sequentially under each of the first plasma pixel pattern 50 and the second plasma pixel pattern 54, the wafer has a complementary plasma exposure to the first plasma pixel pattern and the second plasma pixel pattern 60, illustrated in FIG. 10C. The result is a film having a substantially uniform plasma exposure and high thickness and property uniformity.

Figure 11A:
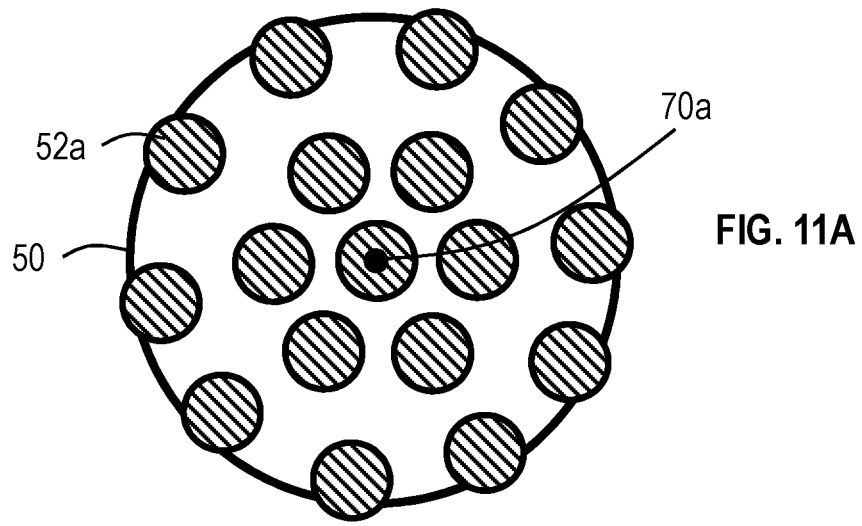
FIG. 11A depicts a plasma source with a pixel pattern according to one or more embodiments.
Figure 11B:
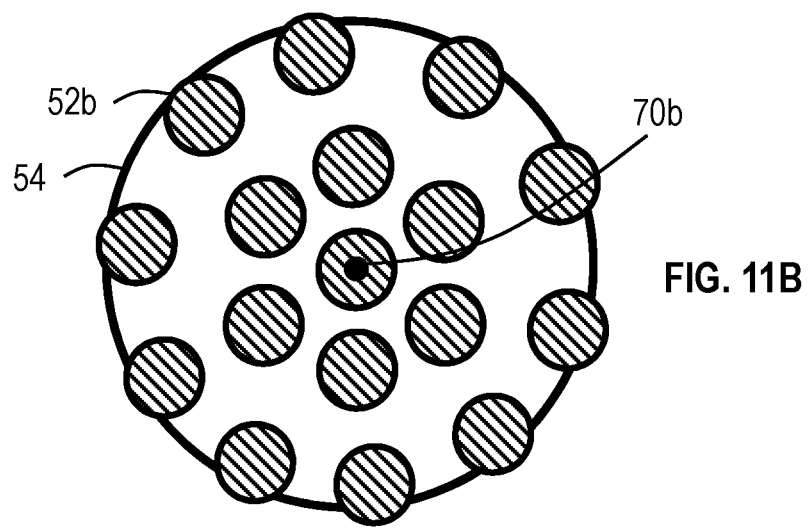
FIG. 11B depicts a plasma source with a pixel pattern according to one or more embodiments.
Figure 11C:
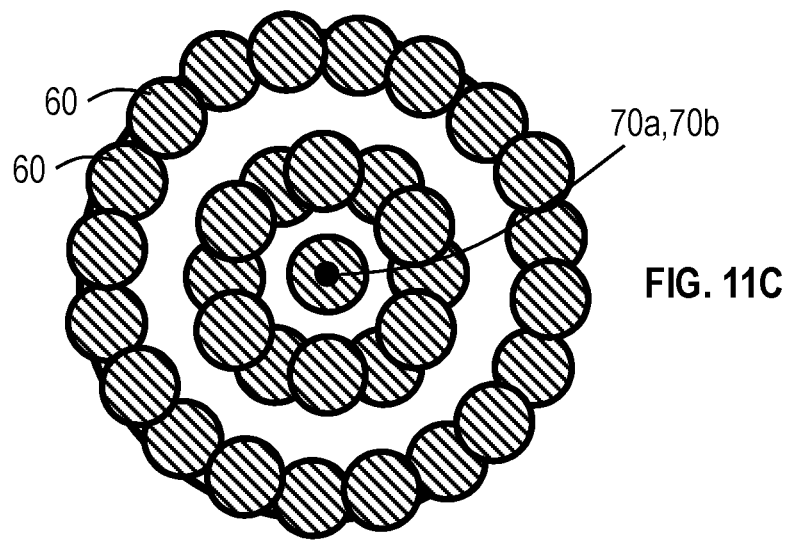
FIG. 11C depicts a complementary plasma pixel pattern according to one or more embodiments.

Referring to FIG. 11A, a first plasma pixel pattern 50 has an outer ring plus a radial pattern 52a with seventeen sources around axis 70a. Referring to FIG. 11B, a second plasma pixel pattern 54 has an outer ring plus a radial pattern 52b with seventeen sources around axis 70b and slightly rotated relative to the first plasma pixel pattern 50. In one or more embodiments, the symmetry of the pixel pattern 52a is 2-fold (i.e. n=2), and one or more of the second plasma pixel pattern, the second gas diffuser, second cooling channel pattern, or the second heater is rotated less than or equal to about 90° (i.e. $(360/(n*2))=(360/(2*2))=(360/4)=90$ degrees) relative to the first plasma pixel pattern, the first gas diffuser, the first cooling channel pattern, or the first heater. When a wafer is processed sequentially under each of the first plasma pixel pattern 50 and the second plasma pixel pattern 54, the wafer has a complementary plasma exposure to the first plasma pixel pattern and the second plasma pixel pattern 60, illustrated in FIG. 11C. The result is a film having a substantially uniform plasma exposure and high thickness and property uniformity.

Figure 12:
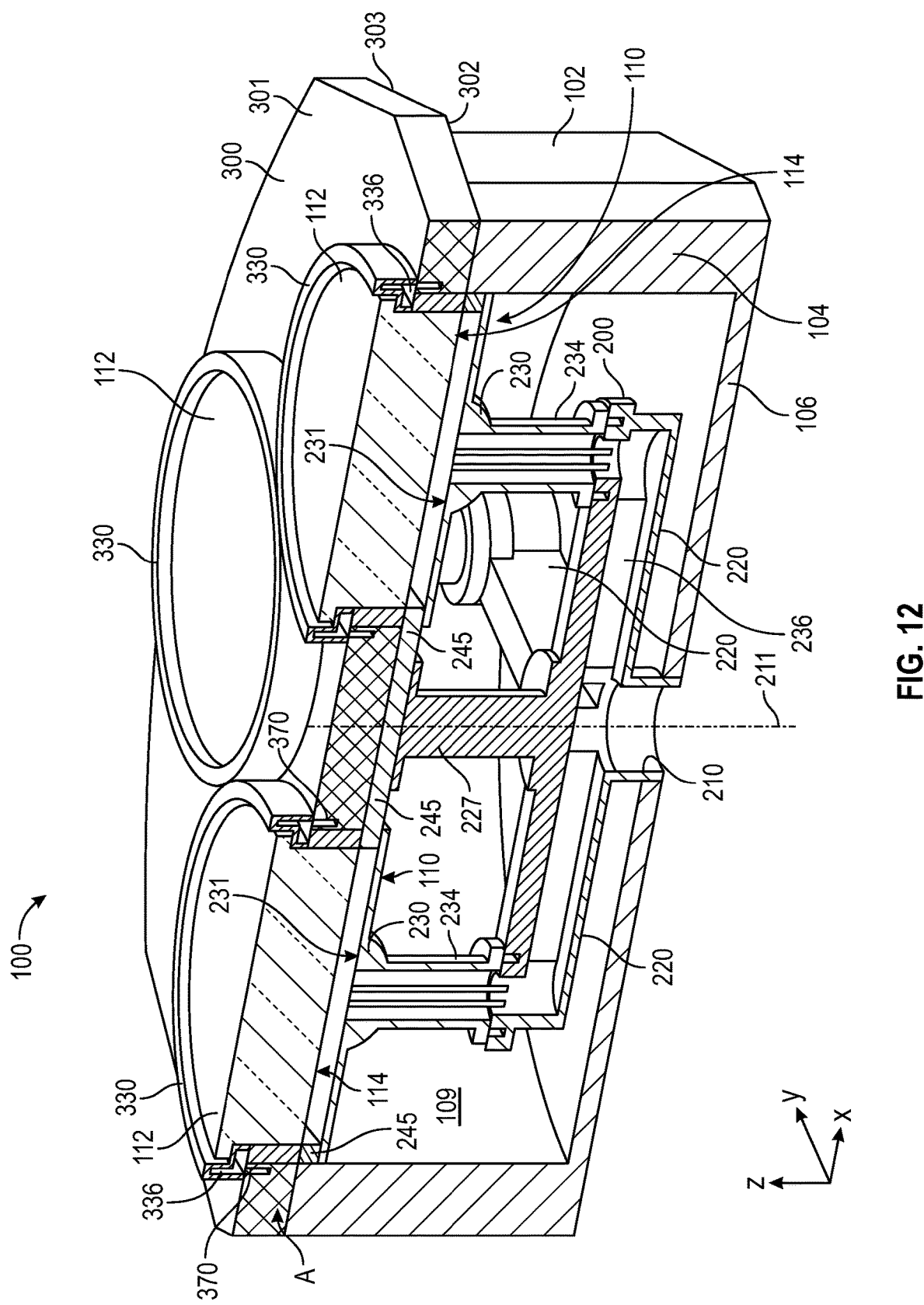
FIG. 12 shows a cross-sectional isometric view of a processing chamber in accordance with one or more embodiment of the disclosure.
Figure 13:
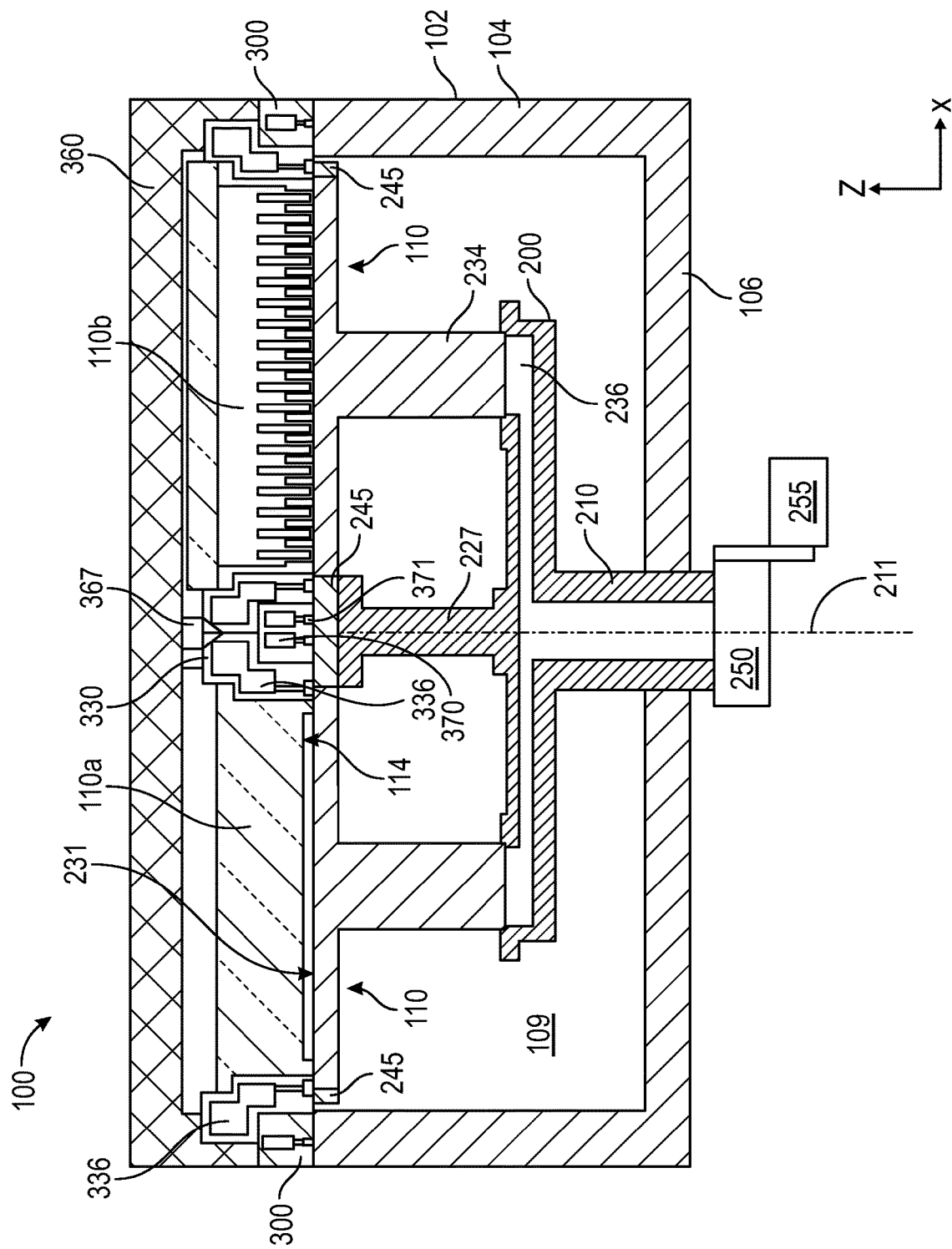
FIG. 13 shows a cross-sectional view of a processing chamber in accordance with one or more embodiment of the disclosure.

FIGS. 12 and 13 illustrate a processing chamber 100 in accordance with one or more embodiment of the disclosure. FIG. 12 shows the processing chamber 100 illustrated as a cross-sectional isometric view in accordance with one or more embodiment of the disclosure. FIG. 13 shows a processing chamber 100 in cross-section according to one or more embodiment of the disclosure. Accordingly, some embodiments of the disclosure are directed to processing chambers 100 that incorporate a support assembly 200 and top plate 300.

The processing chamber 100 has a housing 102 with walls 104 and a bottom 106. The housing 102 along with the top plate 300 define an interior volume 109, also referred to as a processing volume.

The processing chamber 100 includes a plurality of processing stations 110. The processing stations 110 are located in the interior volume 109 of the housing 102 and are positioned in a circular arrangement around the rotational axis 211 of the support assembly 200. Each processing station 110 comprises a gas injector 112 having a front face 114. In some embodiments, the front faces 114 of each of the gas injectors 112 are substantially coplanar. As used in this manner, "substantially coplanar" means that the planes formed by the gas injectors 112 are within ±5°, ±4°, ±3°, ±2° or ±1° of the planes formed by the other gas injectors 112. In some embodiments, the term "substantially coplanar" means that the planes formed by the individual gas injectors are within ±50 µm, ±40 µm, ±30 µm, ±20 µm or ±10 µm.

The processing stations 110 are defined as a region in which processing can occur. For example, a processing station 110 can be defined by the support surface 231 of the heaters 230, as described below, and the front face 114 of the gas injectors 112.

In some embodiments, the processing stations 110 have a gas flow pattern from one or more of a gas diffuser, a cooling channel, or a heater. In some embodiments, the gas injector (or gas diffuser) 112 is a showerhead type gas diffuser and has a symmetrical hole pattern with n-fold-symmetry. In other embodiments, the processing station 110 is configured to operate as a plasma station and the gas injector 112 is a plasma station having a pixelated geometry to produce a complementary plasma pattern. The complementary pattern of the plasma pattern can be controlled by rotation around a central axis of the plasma pixel pattern, the central axis of the plasma pixel pattern. For example, the embodiment illustrated in FIG. 5C can be the result of rotation around the plasma pixel pattern central axis or the process station central axis. The complementary plasma pattern can also be controlled by using 2 different plasma pixel patterns, illustrated in FIG. 11C.

The processing stations 110 can be configured to perform any suitable process and provide any suitable process conditions. The type of gas injector 112 used will depend on, for example, the type of process being performed and the type of showerhead or gas injector. For example, a processing station 110 configured to operate as an atomic layer deposition apparatus may have a showerhead or vortex type gas injector. Whereas, a processing station 110 configured to operate as a plasma station may have one or more electrode and/or grounded plate configuration to generate a plasma while allowing a plasma gas to flow toward the wafer. The embodiment illustrated in FIG. 13 has a different type of processing station 110 on the left side (processing station 110a) of the drawing than on the right side (processing station 110b) of the drawing. Suitable processing stations 110 include, but are not limited to, thermal processing stations, microwave plasma, three-electrode CCP, ICP, parallel plate CCP, UV exposure, laser processing, pumping chambers, annealing stations and metrology stations.

Figure 14:
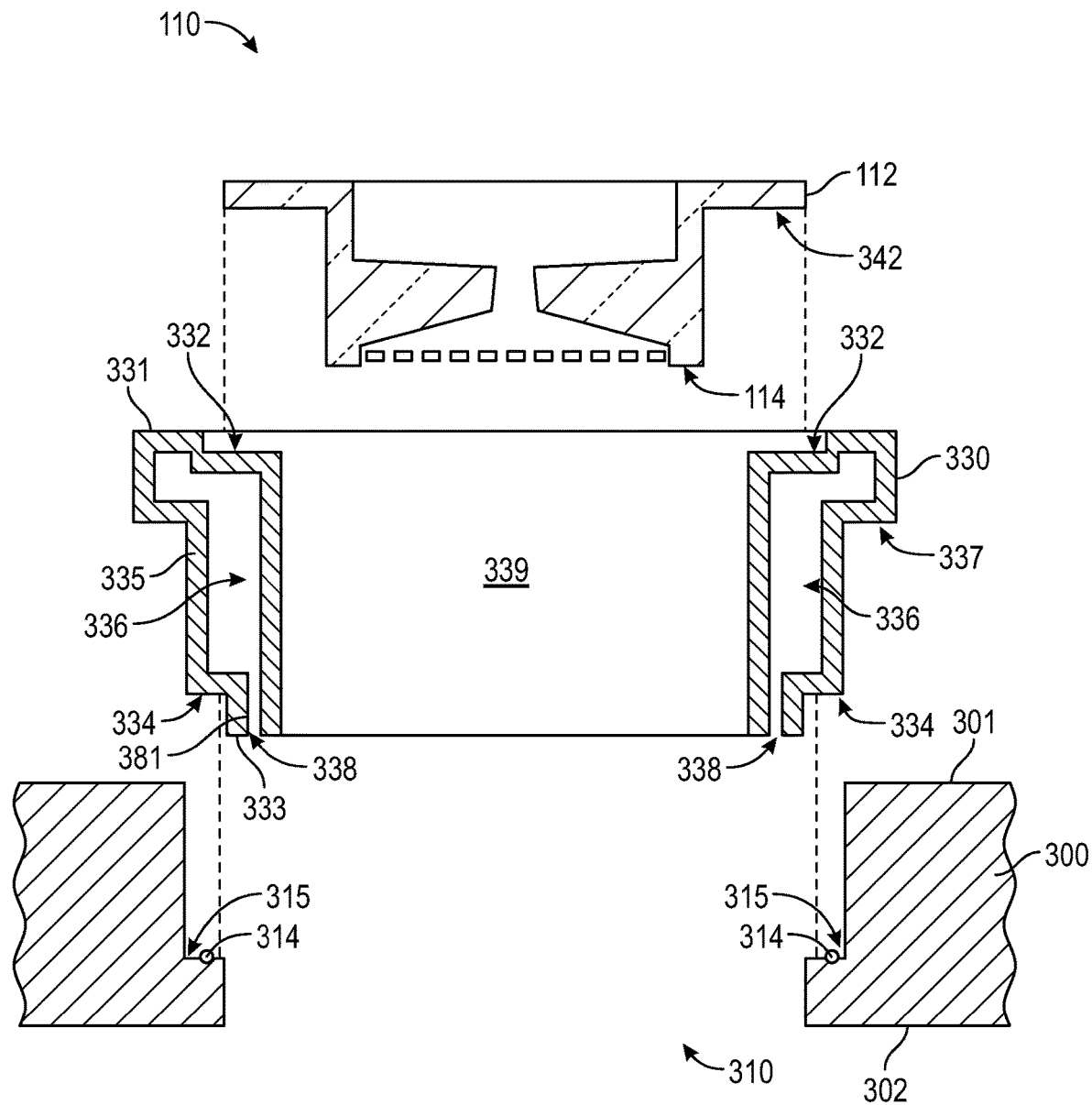
FIG. 14 is an exploded cross-sectional view of a processing station in accordance with one or more embodiment of the disclosure.

FIG. 14 illustrates an exploded view of a processing station 110 in accordance with one or more embodiment of the disclosure. The processing station 110 illustrated comprises three main components: the top plate 300 (also called a lid), a pump/purge insert 330 and a gas injector 112. The gas injector 112 shown in FIG. 14 is a showerhead type gas injector. In some embodiments, the insert is connected to or in fluid communication with a vacuum (exhaust). In some embodiments, the insert is connected to or in fluid communication with a purge gas source.

The openings 310 in the top plate 300 can be uniformly sized or have different sizes. Different sized/shape gas injectors 112 can be used with a pump/purge insert 330 that is suitably shaped to transition from the opening 310 to the gas injector 112. For example, as illustrated, the pump/purge insert 330 includes a top 331 and bottom 333 with a sidewall 335. When inserted into the opening 310 in the top plate 300, a ledge 334 adjacent the bottom 333 can be positioned on the shelf 315 formed in the opening 310. In some embodiments, there is no shelf 315 in the opening and a flange portion 337 of the pump/purge insert 330 rests on top of the top plate 300. In the illustrated embodiment, the ledge 334 rests on shelf 315 with an o-ring 314 positioned between to help form a gas-tight seal.

In some embodiments, there are one or more purge rings 309 in the top plate 300. The purge rings 309 can be in fluid communication with a purge gas plenum (not shown) or a purge gas source (not shown) to provide a positive flow of purge gas to prevent leakage of processing gases from the processing chamber.

The pump/purge insert 330 of some embodiments includes a gas plenum 336 with at least one opening 338 in the bottom 333 of the pump/purge insert 330. The gas plenum 336 has an inlet (not shown), typically near the top 331 or sidewall 335 of the pump/purge insert 330.

In some embodiments, the plenum 336 can be charged with a purge or inert gas which can pass through the opening 338 in the bottom 333 of the pump/purge insert 330. The gas flow through the opening 338 can help create a gas curtain type barrier to prevent leakage of process gases from the interior of the processing chamber.

In some embodiments, the plenum 336 is connected to or in fluid communication with a vacuum source. In such an embodiment, gases flow through the opening 338 in the bottom 333 of the pump/purge insert 330 into the plenum 336. The gases can be evacuated from the plenum to exhaust. Such arrange can be used to evacuate gases from the processing station 110 during use.

The pump/purge insert 330 includes an opening 339 in which a gas injector 112 can be inserted. The gas injector 112 illustrated has a flange 342 which can be in contact with the ledge 332 adjacent the top 331 of the pump/purge insert 330. The diameter or width of the gas injector 112 can be any suitable size that can fit within the opening 339 of the pump/purge insert 330. This allows gas injectors 112 of various types to be used within the same opening 310 in the top plate 300.

Figure 15:
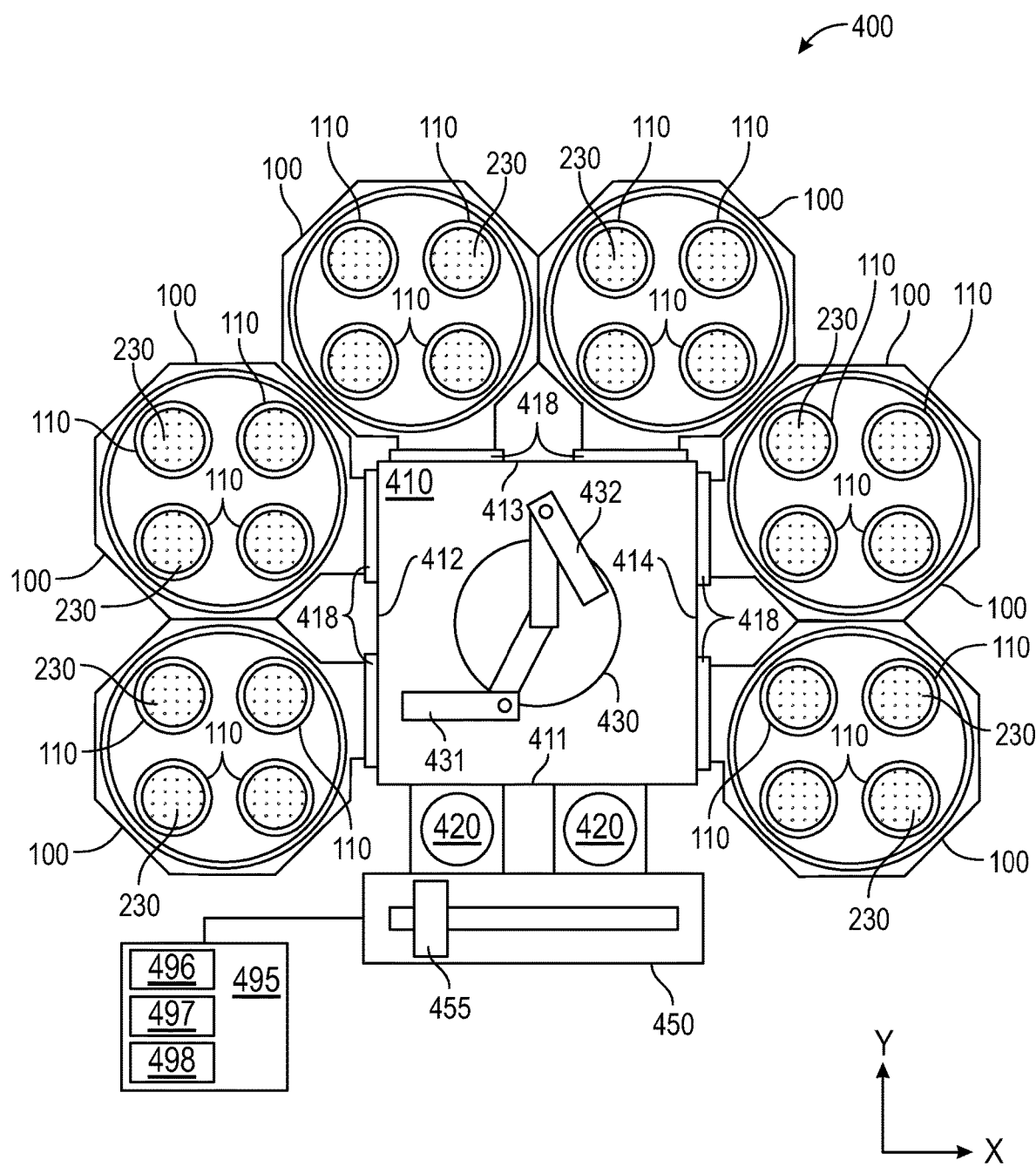
FIG. 15 is a schematic representation of a processing platform in accordance with one or more embodiment of the disclosure.

FIG. 15 shows a processing platform 400 in accordance with one or more embodiment of the disclosure. The embodiment shown in FIG. 15 is merely representative of one possible configuration and should not be taken as limiting the scope of the disclosure. For example, in some embodiments, the processing platform 400 has a different numbers of one or more of the processing chambers 100, buffer stations 420 and/or robot 430 configurations than the illustrated embodiment.

The exemplary processing platform 400 includes a central transfer station 410 which has a plurality of sides 411, 412, 413, 414. The transfer station 410 shown has a first side 411, a second side 412, a third side 413 and a fourth side 414. Although four sides are shown, those skilled in the art will understand that there can be any suitable number of sides to the transfer station 410 depending on, for example, the overall configuration of the processing platform 400. In some embodiments, there the transfer station 410 has three sides, four sides, five sides, six sides, seven sides or eight sides.

The transfer station 410 has a robot 430 positioned therein. The robot 430 can be any suitable robot capable of moving a wafer during processing. In some embodiments, the robot 430 has a first arm 431 and a second arm 432. The first arm 431 and second arm 432 can be moved independently of the other arm. The first arm 431 and second arm 432 can move in the x-y plane and/or along the z-axis. In some embodiments, the robot 430 includes a third arm (not shown) or a fourth arm (not shown). Each of the arms can move independently of other arms.

The embodiment illustrated includes six processing chambers 100 with two connected to each of the second side 412, third side 413 and fourth side 414 of the central transfer station 410. Each of the processing chambers 100 can be configured to perform different processes.

The processing platform 400 can also include one or more buffer station 420 connected to the first side 411 of the central transfer station 410. The buffer stations 420 can perform the same or different functions. For example, the buffer stations may hold a cassette of wafers which are processed and returned to the original cassette, or one of the buffer stations may hold unprocessed wafers which are moved to the other buffer station after processing. In some embodiments, one or more of the buffer stations are configured to pre-treat, pre-heat or clean the wafers before and/or after processing.

The processing platform 400 may also include one or more slit valves 418 between the central transfer station 410 and any of the processing chambers 100. The slit valves 418 can open and close to isolate the interior volume within the processing chamber 100 from the environment within the central transfer station 410. For example, if the processing chamber will generate plasma during processing, it may be helpful to close the slit valve for that processing chamber to prevent stray plasma from damaging the robot in the transfer station.

The processing platform 400 can be connected to a factory interface 450 to allow wafers or cassettes of wafers to be loaded into the processing platform 400. A robot 455 within the factory interface 450 can be used to move the wafers or cassettes into and out of the buffer stations. The wafers or cassettes can be moved within the processing platform 400 by the robot 430 in the central transfer station 410. In some embodiments, the factory interface 450 is a transfer station of another cluster tool (i.e., another multiple chamber processing platform).

A controller 495 may be provided and coupled to various components of the processing platform 400 to control the operation thereof. The controller 495 can be a single controller that controls the entire processing platform 400, or multiple controllers that control individual portions of the processing platform 400. For example, the processing platform 400 may include separate controllers for each of the individual processing chambers 100, central transfer station 410, factory interface 450 and robots 430.

In some embodiments, the processing chamber 100 further comprises a controller 495 connected to the plurality of substantially coplanar support surfaces 231 configured to control one or more of the first temperature or the second temperature. In one or more embodiments, the controller 495 controls a movement speed of the substrate support assembly 200 (FIG. 13).

In some embodiments, the controller 495 includes a central processing unit (CPU) 496, a memory 497, and support circuits 498. The controller 495 may control the processing platform 400 directly, or via computers (or controllers) associated with particular process chamber and/or support system components.

The controller 495 may be one of any form of general-purpose computer processor that can be used in an industrial setting for controlling various chambers and sub-processors. The memory 497 or computer readable medium of the controller 495 may be one or more of readily available memory such as random access memory (RAM), read only memory (ROM), floppy disk, hard disk, optical storage media (e.g., compact disc or digital video disc), flash drive, or any other form of digital storage, local or remote. The memory 497 can retain an instruction set that is operable by the processor (CPU 496) to control parameters and components of the processing platform 400.

The support circuits 498 are coupled to the CPU 496 for supporting the processor in a conventional manner. These circuits include cache, power supplies, clock circuits, input/output circuitry and subsystems, and the like. One or more processes may be stored in the memory 498 as software routine that, when executed or invoked by the processor, causes the processor to control the operation of the processing platform 400 or individual processing chambers in the manner described herein. The software routine may also be stored and/or executed by a second CPU (not shown) that is remotely located from the hardware being controlled by the CPU 496.

Some or all of the processes and methods of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

In some embodiments, the controller 495 has one or more configurations to execute individual processes or sub-processes to perform the method. The controller 495 can be connected to and configured to operate intermediate components to perform the functions of the methods. For example, the controller 495 can be connected to and configured to control one or more of gas valves, actuators, motors, slit valves, vacuum control or other components.

In one or more embodiments, the processing chamber 100 further comprises at least one wafer on the support surface. In some embodiments, the first emissivity and the first temperature and/or the second emissivity and the second temperature provide a steady state temperature of the wafer in the first station and in the second station.

Figure 16A:
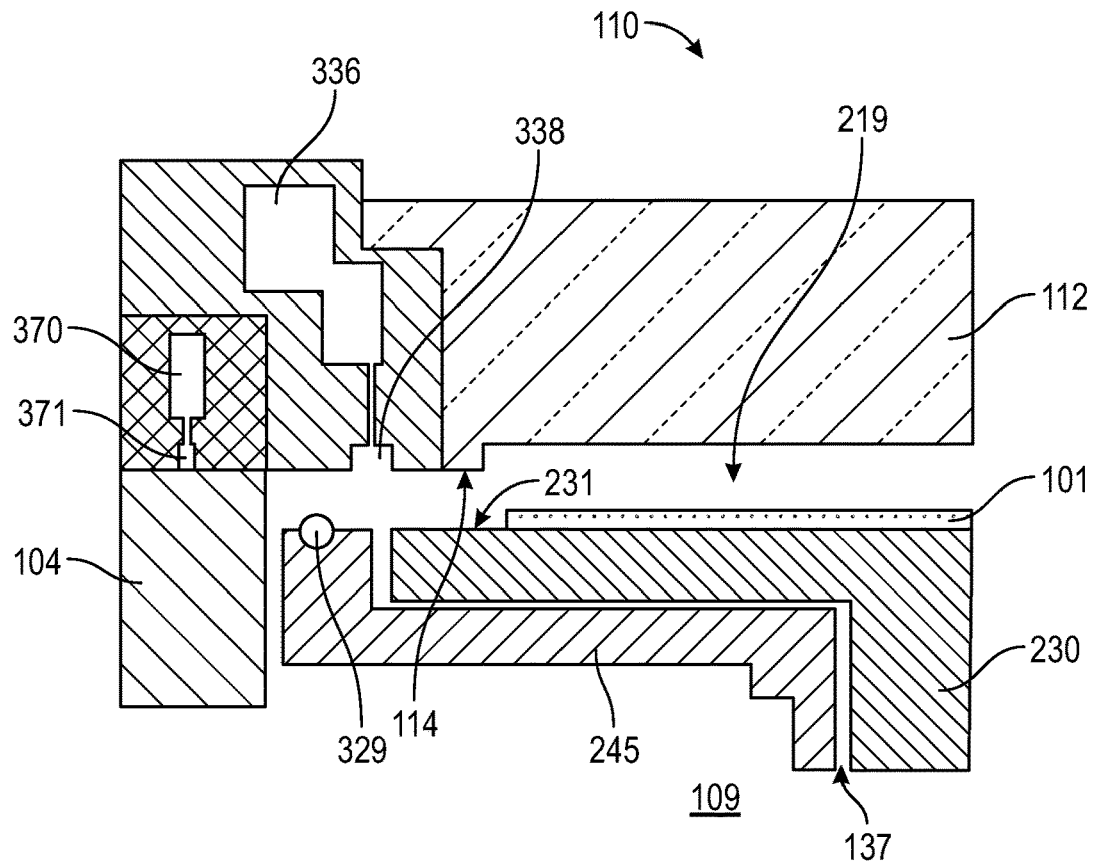
FIGS. 16A and 16B show schematic representations of a process in accordance with one or more embodiment of the disclosure.
Figure 16B:
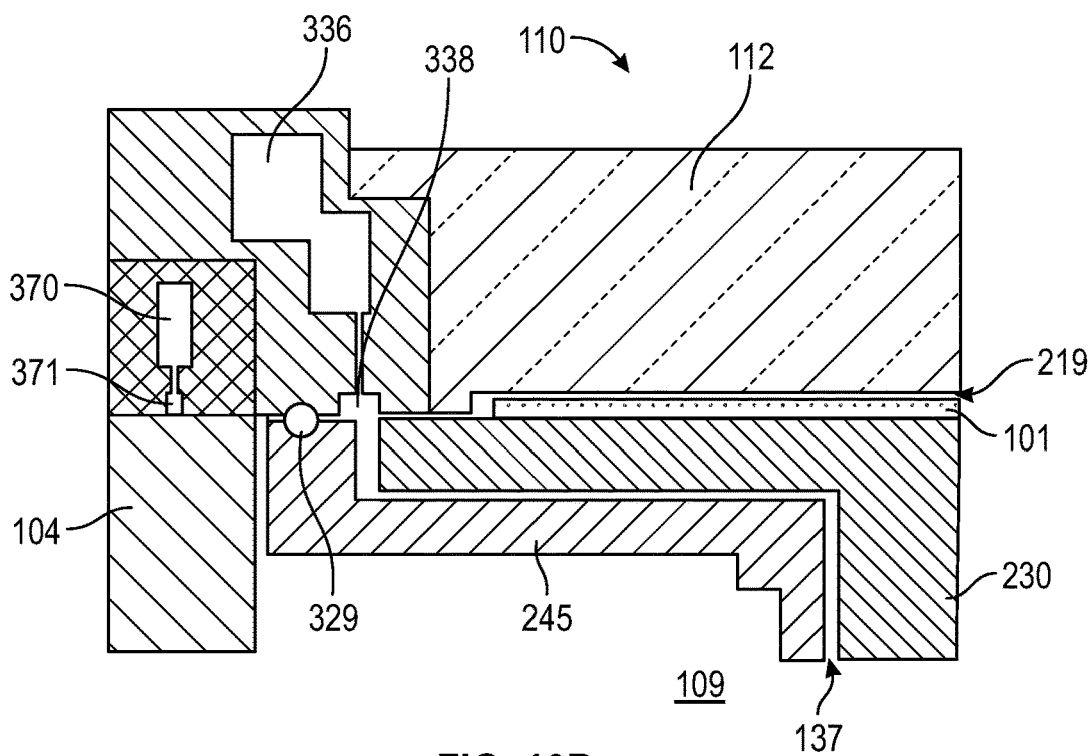

FIGS. 16A and 16B illustrate another embodiment of the disclosure. FIG. 16A shows a partial view of a heater 230 and support plate 245 which has been rotated to a position beneath processing station 110 so that wafer 101 is adjacent the gas injector 112. An O-ring 329 on the support plate 245, or on an outer portion of the heater 230, is in a relaxed state.

In some embodiments, the processing stations 110 have a gas flow pattern from the heater 230. In some embodiments, the heater 230 has a symmetrical hole pattern with n-fold-symmetry.

FIG. 16B shows the support plate 245 and heater 230 after being moved toward the processing station 110 so that the support surface 231 of the heater 230 is in contact with or nearly contacts the front face 114 of the gas injector 112 in the processing station 110. In this position, O-ring 329 is compressed forming a seal around the outer edge of the support plate 245 or outer portion of the heater 230. This allows the wafer 101 to be moved as close the gas injector 112 as possible to minimize the volume of the reaction region 219 so that the reaction region 219 can be rapidly purged.

Gases which might flow out of the reaction region 219 are evacuated through opening 338 into plenum 336 and to an exhaust or foreline (not shown). A purge gas curtain outside of the opening 338 can be generated by purge gas plenum 370 and purge gas port 371. Additionally, a gap 137 between the heater 230 and the support plate 245 can help to further curtain off the reaction region 219 and prevent reactive gases from flowing into the interior volume 109 of the processing chamber 100.

Referring back to FIG. 15, the controller 495 of some embodiments has one or more configurations selected from: a configuration to move a substrate on the robot between the plurality of processing chambers; a configuration to load and/or unload substrates from the system; a configuration to open/close slit valves; a configuration to provide power to one or more of the heaters; a configuration to measure the temperature of the heaters; a configuration to measure the temperature of the wafers on the heaters; a configuration to load or unload wafers from the heaters; a configuration to provide feedback between temperature measurement and heater power control; a configuration to rotate the support assembly around the rotational axis; a configuration to move the support assembly along the rotational axis (i.e., along the z-axis); a configuration to set or change the rotation speed of the support assembly; a configuration to provide a flow of gas to a gas injector; a configuration to provide power to one or more electrodes to generate a plasma in a gas injector; a configuration to control a power supply for a plasma source; a configuration to control the frequency and/or power of the plasma source power supply; and/or a configuration to provide control for a thermal anneal treatment station.

One or more embodiments are directed to a processing chamber 100 comprising a first plasma processing station 110a having a first plasma pixel pattern from a first plasma source 112, the first plasma source 112 having a symmetrical plasma pixel pattern with n-fold symmetry; and a second plasma processing station 110b having a second plasma pixel pattern from a second plasma source 112 with n-fold symmetry and rotated relative to the first plasma source 112 to a provide a second plasma pixel pattern complementary to the first plasma pixel pattern. In one or more embodiments, the second plasma source is rotated less than or equal to about $(360/(n*2))$ degrees relative to the first plasma source. In further embodiments, each of the first plasma source and the second plasma source have an identical symmetrical pixel pattern with n-fold symmetry. In one or more embodiments, n is an integer in a range of from 2 to 10. In further embodiments, the first plasma source and the second plasma source have different plasma pixel patterns to form complementary plasma pixel pattern.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A processing chamber comprising:
 a first processing station having a first gas flow pattern from one or more of a first gas diffuser, a first cooling channel pattern, or a first heater; and
 a second processing station having a second gas flow pattern from one or more of a second gas diffuser, a second cooling channel pattern, or a second heater, the second gas diffuser, the second cooling channel pattern, or the second heater rotated relative to the first gas diffuser, the first cooling channel pattern, or the first heater to provide the second gas flow pattern complementary to the first gas flow pattern, wherein the first gas flow pattern and the second gas flow pattern have a symmetrical pattern with n-fold symmetry, where n is an integer in a range of from 2 to 10,
 wherein one or more of the second gas diffuser, second cooling channel pattern, or second heater is rotated less than or equal to about $(360/(n*2))$ degrees relative to the first gas diffuser.

2. The processing chamber of claim 1, wherein each of the first gas diffuser, the first cooling channel pattern, or the first heater and the second gas diffuser, the second cooling channel pattern, or the second heater have an identical symmetrical pattern with n-fold symmetry, and the second gas diffuser, the second cooling channel pattern, or the second heater are rotated less than or equal to about $(360/(n*2))$ degrees relative to the first gas diffuser, the first cooling channel pattern, or the first heater.

3. The processing chamber of claim 1, further comprising heaters on one or more of the first processing station or the second processing station.

4. The processing chamber of claim 1, further comprising a controller connected to one or more of the first processing station or the second processing station.

5. The processing chamber of claim 1, further comprising at least one wafer on one or more of the first processing station or the second processing station.

6. A method of forming a film, the method comprising:
 loading at least one wafer onto a substrate support surface;
 rotating the substrate support surface between a first processing station having a first gas flow pattern from one or more of a first gas diffuser, a first cooling channel pattern, or a first heater and a second processing station having a second gas flow pattern from one or more of a second gas diffuser, a second cooling channel pattern, or a second heater, the second gas diffuser, the second cooling channel pattern, or the second heater rotated relative to the first gas diffuser, the first cooling channel pattern, or the first heater to provide the second gas flow pattern complementary to the first gas flow pattern wherein the first cooling channel pattern and the second cooling channel pattern have a symmetrical pattern with n-fold symmetry, where n is an integer in a range of from 2 to 10 and one or more of the second gas diffuser, the second cooling channel pattern, or the second heater is rotated less than or equal to about $(360/(n*2))$ degrees relative to one or more of the first gas diffuser, the first cooling channel pattern, or the first heater; and
 at each processing station, exposing a top surface of the at least one wafer to a process condition to form a film having a substantially uniform thickness.

7. The method of claim 6, wherein the at least one wafer is stationary when the film is formed.

8. The method of claim 6, wherein each of the first gas diffuser, the first cooling channel pattern, or the first heater and the second gas diffuser, the second cooling channel pattern, or the second heater have an identical symmetrical pattern with n-fold symmetry, and one or more of the second gas diffuser, the second cooling channel pattern, or the second heater is rotated less than or equal to about $(360/(n*2))$ degrees relative to the first gas diffuser, the first cooling channel pattern, or the first heater.

9. The method of claim 6, further comprising controlling the speed of rotation of the substrate support surface.

10. A processing chamber comprising:
 a first plasma processing station having a first plasma pixel pattern from a first plasma source, the first plasma source having a symmetrical pixel pattern with n-fold symmetry, wherein n is an integer in a range of from 2 to 10; and
 a second plasma processing station having a second plasma pixel pattern from a second plasma source, the second plasma source having a symmetrical pixel pattern with n-fold symmetry and rotated relative to the first plasma source to provide a second plasma pixel pattern complementary to the first plasma pixel pattern,
wherein n is an integer in a range of from 2 to 10,
wherein the second plasma source is rotated less than or equal to about (360/(n*2)) degrees relative to the first plasma source.

11. The processing chamber of claim 10, wherein the second plasma source has a different plasma pixel pattern from first plasma source, but complementary to the first plasma source.

12. The processing chamber of claim 10, wherein each of the first plasma source and the second plasma source have an identical symmetrical pixel pattern with n-fold symmetry.

13. The processing chamber of claim 10, further comprising a gas diffuser, a cooling channel, heaters on one or more of the first plasma processing station or the second plasma processing station.

* * * * *